(12) United States Patent
Hashimoto et al.

(10) Patent No.: US 10,933,589 B2
(45) Date of Patent: Mar. 2, 2021

(54) DATA CONVERSION DEVICE AND LAMINATION SHAPING SYSTEM

(71) Applicant: FUJI CORPORATION, Chiryu (JP)

(72) Inventors: Yoshitaka Hashimoto, Kariya (JP); Masatoshi Fujita, Anjo (JP); Kenji Tsukada, Toyota (JP); Akihiro Kawajiri, Chiryu (JP); Masato Suzuki, Chiryu (JP); Katsuaki Makihara, Gamagori (JP)

(73) Assignee: FUJI CORPORATION, Chiryu (JP)

( * ) Notice: Subject to any disclaimer, the term of this patent is extended or adjusted under 35 U.S.C. 154(b) by 49 days.

(21) Appl. No.: 16/468,930

(22) PCT Filed: Dec. 13, 2016

(86) PCT No.: PCT/JP2016/087035
§ 371 (c)(1),
(2) Date: Jun. 12, 2019

(87) PCT Pub. No.: WO2018/109832
PCT Pub. Date: Jun. 21, 2018

(65) Prior Publication Data
US 2019/0337234 A1     Nov. 7, 2019

(51) Int. Cl.
*B29C 64/393*     (2017.01)
*B33Y 50/00*     (2015.01)
(Continued)

(52) U.S. Cl.
CPC .......... *B29C 64/393* (2017.08); *B29C 64/209* (2017.08); *B29C 67/0011* (2013.01);
(Continued)

(58) Field of Classification Search
None
See application file for complete search history.

(56) References Cited

U.S. PATENT DOCUMENTS

| | | |
|---|---|---|
| 8,191,018 B1 | 5/2012 | Molesa et al. |
| 2006/0054039 A1 | 3/2006 | Kritchman et al. |

(Continued)

FOREIGN PATENT DOCUMENTS

| | | |
|---|---|---|
| JP | 2006-130864 A | 5/2006 |
| JP | 2009-255007 A | 11/2009 |

(Continued)

OTHER PUBLICATIONS

Extended European Search Report dated Dec. 11, 2019 in European Patent Application No. 16923988.6, 9 pages.

(Continued)

*Primary Examiner* — Carlos R Ortiz Rodriguez
(74) *Attorney, Agent, or Firm* — Oblon, McClelland, Maier & Neustadt, L.L.P.

(57) ABSTRACT

To provide a data conversion device capable of generating data necessary for shaping a target object using an inkjet method from three-dimensional data in accordance with an impact diameter. Grid data generation section of data conversion device generates grid data obtained by defining layer data by each grid region indicating a position to which a droplet is ejected by the inkjet method. Ejection position change section changes the position (ejection region) to which the droplet is ejected on grid data, based on impact diameter when the droplet is ejected and length of grid regions.

9 Claims, 12 Drawing Sheets

(51) Int. Cl.
*B29C 64/209* (2017.01)
*B29C 67/00* (2017.01)
*G06F 30/00* (2020.01)
*B32B 37/00* (2006.01)

(52) U.S. Cl.
CPC .............. *B33Y 50/00* (2014.12); *G06F 30/00* (2020.01); *B32B 2037/0061* (2013.01)

(56) References Cited

U.S. PATENT DOCUMENTS

| | | |
|---|---|---|
| 2007/0153302 A1 | 7/2007 | Lin et al. |
| 2008/0110395 A1 | 5/2008 | Kritchman et al. |
| 2008/0118655 A1 | 5/2008 | Kritchman |
| 2008/0121130 A1 | 5/2008 | Kritchman |
| 2008/0121172 A1 | 5/2008 | Kritchman et al. |
| 2008/0124464 A1 | 5/2008 | Kritchman et al. |
| 2008/0124475 A1 | 5/2008 | Kritchman |
| 2008/0166480 A1 | 7/2008 | Kritchman et al. |
| 2011/0241240 A1 | 10/2011 | Gothait et al. |
| 2014/0175706 A1 | 6/2014 | Kritchman |
| 2015/0224709 A1 | 8/2015 | Napadensky |
| 2017/0259469 A1 | 9/2017 | Chechik et al. |
| 2018/0022033 A1 | 1/2018 | Fujita et al. |
| 2019/0047185 A1 | 2/2019 | Kritchman et al. |

FOREIGN PATENT DOCUMENTS

| | | |
|---|---|---|
| JP | 2016-198990 A | 12/2016 |
| WO | WO 2016/125275 A1 | 8/2016 |

OTHER PUBLICATIONS

International Search Report dated Jan. 24, 2017 in PCT/JP2016/087035 filed on Dec. 13, 2016.

FIG. 7

| Member information | Name of grid data (name of image file) | Type of ink | Type of base | Process condition (printing) | | | Process condition (curing) | |
|---|---|---|---|---|---|---|---|---|
| | | | | Name of unit | Name of unit | Printing speed | Name of unit | Curing method |
| Wiring pattern (001) | BMP001-1 | Metal nanoparticles (silver) | Metal (silver) | First shaping unit | First shaping unit | XXm/s | First shaping unit | Firing |
| | BMP001-2 | Metal nanoparticles (silver) | Metal (silver) | First shaping unit | First shaping unit | XXm/s | First shaping unit | Firing |
| | BMP001-3 | Metal nanoparticles (silver) | Metal (silver) | First shaping unit | First shaping unit | XXm/s | First shaping unit | Firing |
| | ... | | | | | | | |
| | BMP001-66 | Metal nanoparticles (silver) | Metal (silver) | First shaping unit | First shaping unit | XXm/s | First shaping unit | Firing |
| | BMP001-67 | Metal nanoparticles (silver) | UV curable resin | First shaping unit | First shaping unit | XXm/s | First shaping unit | Firing |
| | BMP002-1 | UV curable resin | UV curable resin | Second shaping unit | Second shaping unit | XXm/s | Second shaping unit | UV curable resin |
| | BMP002-2 | UV curable resin | UV curable resin | Second shaping unit | Second shaping unit | XXm/s | Second shaping unit | UV curable resin |
| | BMP002-3 | UV curable resin | UV curable resin | Second shaping unit | Second shaping unit | XXm/s | Second shaping unit | UV curable resin |
| Insulating layer (002) | ... | | | | | | | |
| | BMP002-47 | UV curable resin | UV curable resin | Second shaping unit | Second shaping unit | XXm/s | Second shaping unit | UV curable resin |
| | BMP002-48 | UV curable resin | Metal (silver) | Second shaping unit | Second shaping unit | XXm/s | Second shaping unit | UV curable resin |

DATA CONVERSION DEVICE AND LAMINATION SHAPING SYSTEM

TECHNICAL FIELD

The present application relates to a data conversion device for converting three-dimensional data of a target object into data usable for lamination shaping by an inkjet method, and to a lamination shaping system for shaping a target object by the inkjet method based on the converted data.

BACKGROUND ART

As a technique for lamination-shaping a three-dimensional structure by an inkjet method which is one of a lamination shaping method, for example, there is a technique disclosed in Patent Literature 1. In a forming device disclosed in Patent Literature 1, a metal-containing liquid containing metal nanoparticles is ejected from an inkjet head onto a board, and a desired wiring pattern is formed on the board. In the forming device, the wettability of a board surface is controlled by applying a coating liquid on the board before forming a wiring pattern.

PATENT LITERATURES

Patent Literature 1: JP-A-2009-255007

BRIEF SUMMARY

Technical Problem

In the inkjet method, for example, 3D-Computer Aided Design (CAD) data of a target object is divided into layers having a predetermined thickness to generate layer data. Then, the layer data of each layer is defined by grid regions which indicate positions to which liquid droplets are ejected by the inkjet method. The defined data (grid data) is, for example, data in which square grid regions are arranged in a matrix. In this case, if a size of one grid region matches an impact diameter of a droplet ejected from the inkjet head, the pattern to be formed (wiring pattern or the like) has a desired length or width. However, the impact diameter of the droplet varies due to a discharge amount of the droplet and other various factors. For this reason, there is a problem that a pattern of a desired shape cannot be formed due to a variation in the impact diameter.

The present disclosure has been made in view of the above-mentioned problems, and an object of the present disclosure is to provide a data conversion device capable of generating data necessary for lamination-shaping a target object using an inkjet method from three-dimensional data in accordance with an impact diameter, and a lamination shaping system for performing lamination shaping using converted data.

Solution to Problem

In order to solve the above-mentioned problems, the present description discloses a data conversion device including a layer data division section configured to generate layer data by dividing a target object into layers each having a thickness capable of being shaped by an inkjet method based on three-dimensional data of the target object to be subjected to the lamination shaping, a grid data generation section configured to generate grid data by defining the layer data by grid regions each indicating a position to which a droplet is ejected by the inkjet method, an impact diameter determination section configured to determine an impact diameter when the droplet is ejected, and an ejection position change section configured to change a position to which the droplet is ejected on the grid data based on the impact diameter determined by the impact diameter determination section and a size of the grid region.

Furthermore, the present description discloses a lamination shaping system for lamination-shaping a target object by a lamination shaping method based on the grid data converted by the data conversion device.

Advantageous Effects

According to the present disclosure, the ejection position change section changes the position to which the droplet of the grid data is ejected based on the impact diameter of the droplet determined by the impact diameter determination section and the size of the grid region. As a result, after the position is changed, the grid data becomes data in which a size of the grid region indicating the position to which the droplet is ejected and an impact diameter of the droplet are taken into consideration. Therefore, by generating grid data corresponding to an impact diameter, a pattern of a desired shape can be formed even if an impact diameter varies.

BRIEF DESCRIPTION OF DRAWINGS

FIG. 7 is a diagram illustrating associated data.

DESCRIPTION OF EMBODIMENTS

First Embodiment

1. Configuration of Lamination Shaping System

Figure 1:
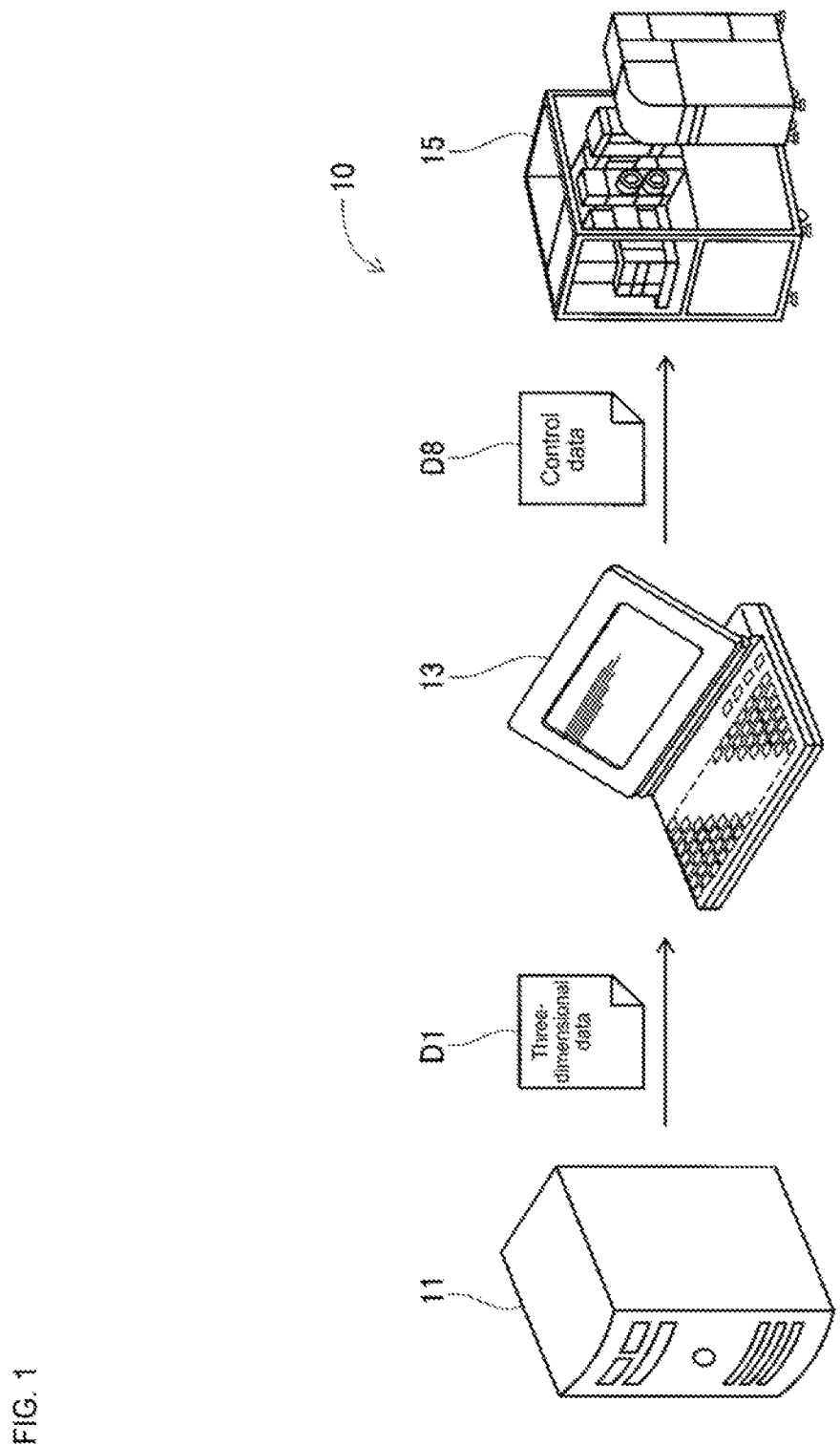
FIG. 1 is a diagram illustrating a configuration of a lamination shaping system according to a first embodiment.

Hereinafter, an embodiment of the lamination shaping system of the present application will be described with reference to the drawings. FIG. 1 illustrates a configuration of lamination shaping system 10 (hereinafter, abbreviated as a "system") according to the present embodiment. System 10 includes server 11, data conversion device 13, and electronic device manufacturing apparatus 15 (hereinafter, abbreviated as a "manufacturing apparatus"). System 10 is a system in which three-dimensional data D1 stored in server 11 is converted by data conversion device 13, and manufacturing apparatus 15 manufactures an electronic device by a lamination shaping method (inkjet method) based on control data D8 after the conversion.

Server 11 stores data designed using, for example, a Computer Aided Design (CAD), as three-dimensional data D1 of an electronic device to be shaped by manufacturing apparatus 15. In three-dimensional data D1, for example, in addition to drawing data such as a shape and a position of a member (wiring pattern, and the like) that the electronic device includes, data related to a material indicating which material forms each member is defined. In response to a request from data conversion device 13, server 11 transmits stored three-dimensional data D1 to data conversion device 13. An input source of three-dimensional data D1 used for the conversion by data conversion device 13 is not particularly limited. For example, data conversion device 13 may receive three-dimensional data D1 from a personal computer other than server 11, or may input three-dimensional data D1 from an external storage medium such as a USB memory, a CD, or a DVD. Alternatively, data conversion device 13 may convert three-dimensional data D1 designed by a user using an input device such as a keyboard included in data conversion device 13.

2. Configuration of Data Conversion Device 13

Figure 2:
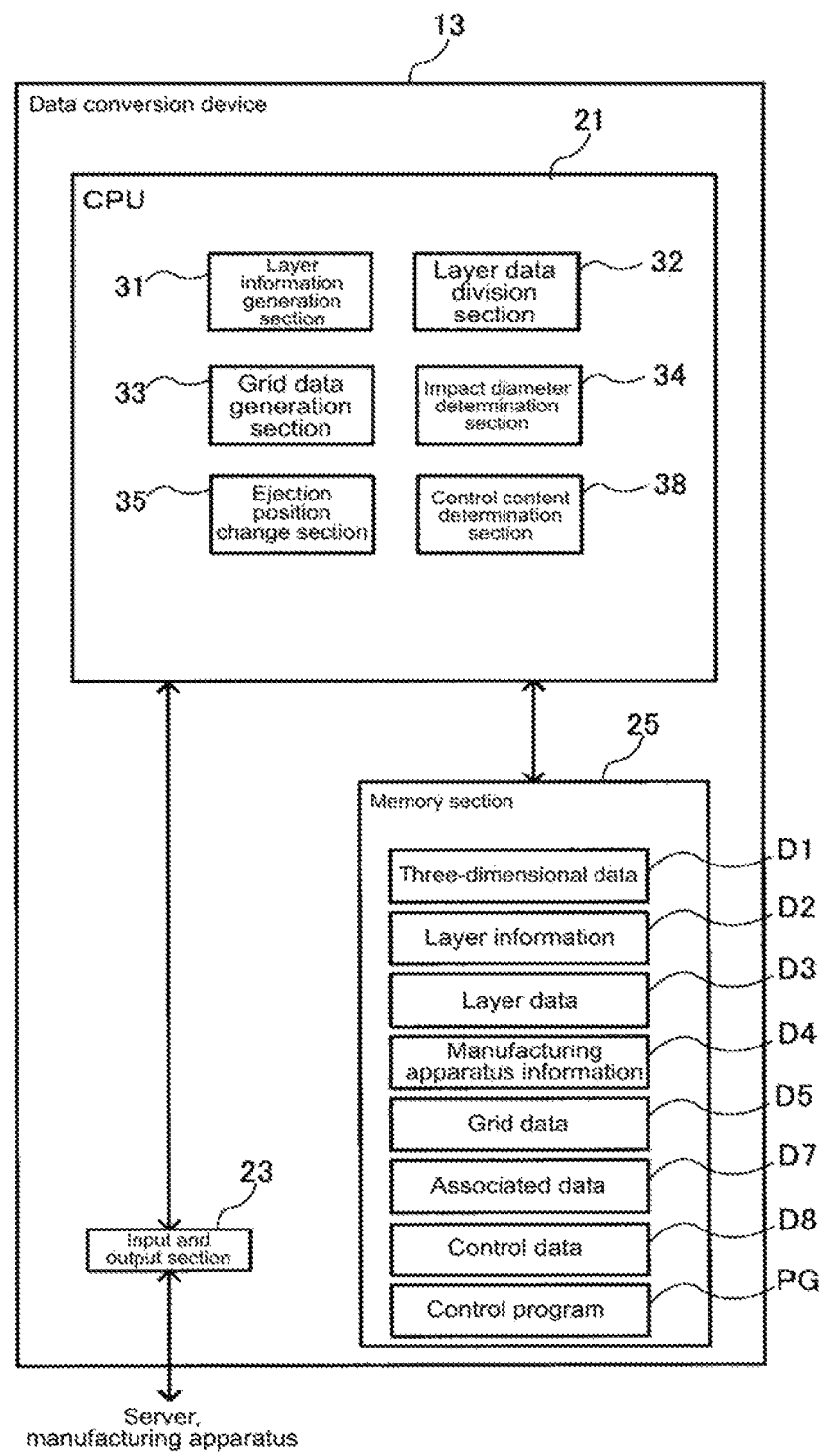
FIG. 2 is a block diagram illustrating a configuration of a data conversion device.

Next, data conversion device 13 will be described. As shown in FIG. 2, data conversion device 13 is, for example, a personal computer mainly composed of a central processing unit (CPU) 21, and includes input and output section 23, memory section 25, and the like. Input and output section 23 is connected to server 11, and inputs three-dimensional data D1 from server 11. CPU 21 temporarily stores three-dimensional data D1 input by input and output section 23 in memory section 25. Memory section 25 includes memories, hard disks, and the like, and stores three-dimensional data D1 and control programs PG and the like to be executed by CPU 21 as well.

CPU 21 reads out and executes control programs PG stored in memory section 25 to realize various process modules of layer information generation section 31, layer data division section 32, grid data generation section 33, impact diameter determination section 34, ejection position change section 35, and control content determination section 38. In this embodiment, layer information generation section 31 or the like is configured as software realized by executing control program PG by CPU 21, but may be configured as a dedicated hardware.

3. Conversion Process of Data

In the following description, as an example, process, illustrated in FIG. 17, performed when three-dimensional data D1 of electronic device 200 including wiring pattern 105, insulating layer 115, pillar 121, and the like is input will be described. Data conversion device 13 is not limited to electronic device 200, and can convert three-dimensional data D1 by executing the same process on a device that can be shaped by using another inkjet method (for example a wearable device such as a pair of glasses with which electronic components is equipped).

3-1. Layer Information Generation Section 31

Layer information generation section 31 illustrated in FIG. 2 detects a member included in three-dimensional data D1 from three-dimensional data D1 of electronic device 200. Layer information generation section 31 generates layer information D2 for each detected member. For example, layer information generation section 31 generates, from three-dimensional data D1, data (manufacturable material) as layer information D2 for each member such as wiring pattern 105 and insulating layer 115 that electronic device 200 is equipped with. Layer information generation section 31 stores generated layer information D2 in memory section 25.

3-2. Layer Data Division Section 32

Layer data division section 32 reads out layer information D2 stored in memory section 25, and generates layer data D3 obtained by dividing a member included in layer information D2 into layers each having a thickness capable of being shaped by an inkjet method. Here, in three-dimensional data D1 stored in server 11 as described above, data related to a material indicating which material can be used to manufacture each member such as wiring pattern 105 is defined. For example, it is assumed that a conductive metal is defined as a material of wiring pattern 105 of electronic device 200. Memory section 25 stores manufacturing apparatus information D4 related to manufacturing apparatus 15 described later. Manufacturing apparatus information D4 is, for example, information on a material that can be ejected by first shaping unit 63 of manufacturing apparatus 15 (see FIG. 16), and information on a thickness of a layer formed in accordance with a droplet when the material is ejected, printing speed, and the like. In manufacturing apparatus information D4, for example, a time (curing time) for firing the discharged droplets by firing section 92 (see FIG. 16) is set.

When droplets of the conductive material are ejected for shaping by the inkjet method, a thickness of a layer that can be shaped at a time is determined according to a size of a droplet of the conductive material to be used, for example, an ink containing metal nanoparticles (such as silver). Layer data division section 32 determines, for example, a correspondence relationship between the data related to the material defined in three-dimensional data D1 and the information of the shapeable material set in manufacturing apparatus information D4. For example, layer data division section 32 determines an appropriate material as the material defined in the three-dimensional data D1 among the shapeable materials set in manufacturing apparatus information D4. For example, when ink containing metal nanoparticles is selected as a layer-shapeable material, layer data division section 32 divides wiring pattern 105 of layer information D2 by the maximum thickness of the layer that can be shaped with the ink, and generates multiple layer data D3. Layer data division section 32 stores each of multiple generated layer data D3 in memory section 25 in association with data related to the material (ink type, and the like) of three-dimensional data D1, layer information D2 of the dividing source, manufacturing apparatus information D4 (unit name to be shaped, shaping method) and the like.

3-3. Grid Data Generation Section 33

Figure 3:
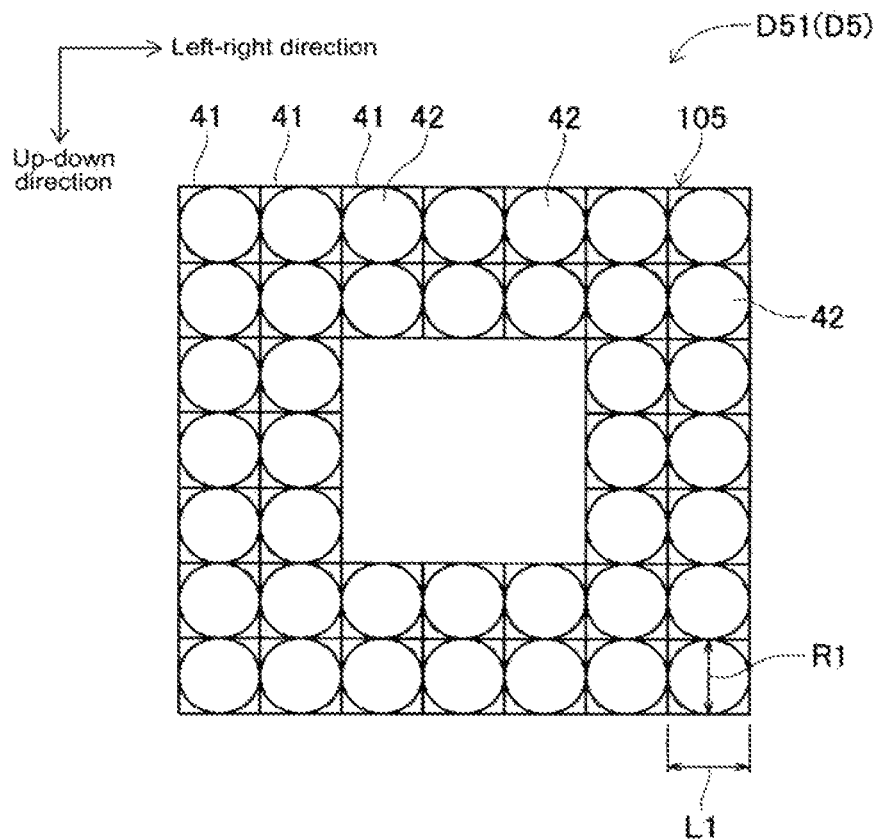
FIG. 3 is a schematic diagram illustrating grid data of a wiring pattern.
Figure 4:
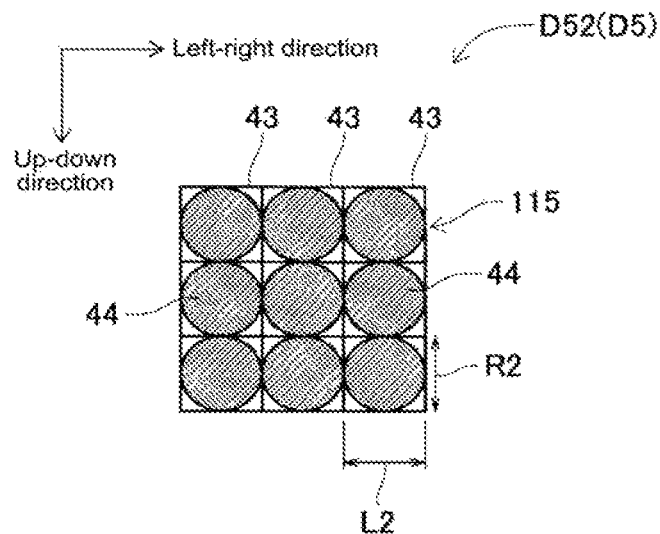
FIG. 4 is a schematic diagram illustrating grid data of an insulating layer.
Figure 5:
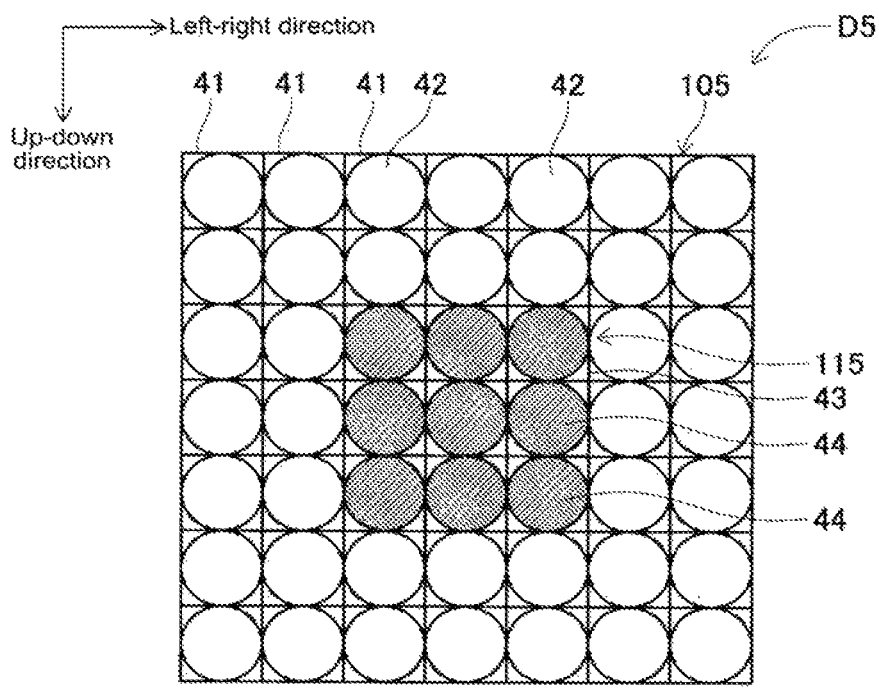
FIG. 5 is a schematic diagram illustrating grid data of the wiring pattern and the insulating layer.

Grid data generation section 33 generates grid data D5 (see FIG. 2) obtained by defining layer data D3 by each grid region indicating a position to which a droplet is ejected by the inkjet method. Specifically, FIGS. 3 to 5 illustrate an example of grid data D5 which is defined by grid regions 41 and 43. Grid data D51 illustrated in FIG. 3 and grid data D52 illustrated in FIG. 4 are data for forming insulating layer 115 inside annular wiring pattern 105 illustrated in FIG. 5, for example.

Grid data D51 and grid data D52 are, for example, image data in which three-dimensional data D1 of the 3D-CAD is divided into each layer to generate layer data D3, and divided layer data D3 is represented in a BMP format. Grid data D5 illustrated in FIGS. 3 to 5 illustrates a state viewed from above in which wiring pattern 105 and insulating layer 115 of electronic device 200 are divided into each layer. Grid data D5 is not limited to BMP format data, and may be data which is defined other predetermined regions (PNG format data, TIF format data, and GIF format data).

As described above, layer data division section 32 of the present embodiment generates layer data D3 for each layer information D2 generated by layer information generation section 31, that is, for each member (for example, wiring pattern 105) included in three-dimensional data D1. Then, grid data generation section 33 generates grid data D5 from layer data D3 for each member. Grid data generation section 33 associates generated grid data D5 with the above-described various data and stores associated data D7 in memory section 25 (see, FIG. 7). Associated data D7 will be described later.

Grid data D51 illustrated in FIG. 3 is grid data D5 of wiring pattern 105. Wiring pattern 105 has a square outer peripheral shape and is formed in an annular shape. Grid data D52 illustrated in FIG. 4 is grid data D5 of insulating layer 115 to be shaped on the inner peripheral side of annular wiring pattern 105. Insulating layer 115 has a square shape. Therefore, in the example illustrated in FIGS. 3 to 5, square insulating layer 115 is formed inside annular wiring pattern 105.

Each of the square in FIG. 3 indicates grid region 41 obtained by defining wiring patterns 105. Grid region 41, as shown in FIG. 3, has a square shape and seven grid regions 41 are respectively arranged in a matrix along a left-right direction and an up-down direction orthogonal thereto. Grid region 41 corresponds to, for example, a region of one pixel (dot) of the image data (grid data D5). In the case where the material of the member, that is, the material of the droplet (ink) for shaping the member is the same, grid data generation section 33 of the present embodiment makes the size of grid region 41 obtained by defining layer data D3 the same. Therefore, for example, grid data generation section 33 makes the sizes of grid regions 41 the same for members using the same metal nanoparticles. Thus, layers, which is shaped with the same kind of droplets, can have same thickness.

Similarly, each of the square in FIG. 4 indicates grid region 43 obtained by defining insulating layers 115. Grid region 43, as shown in FIG. 4, has a square shape and three grid regions 43 are respectively arranged in a matrix along a left-right direction and an up-down direction. For example, grid data generation section 33 of the present embodiment makes the sizes of grid regions 43 the same for members using the same resin material (for example, UV curable resin). Grid regions 41 and 43 are not limited to a square, and may have other shapes (rectangle, a circle, and an ellipse).

Circles illustrated in grid regions 41 of FIG. 3 schematically show a state in which metal droplets 42 of the metal nanoparticles forming wiring pattern 105 are impacted on grid regions 41. In the example illustrated in FIG. 3, diameter (hereinafter referred to as "impact diameter") R1 of impacted metal droplet 42 matches length L1 of square grid region 41 on one side thereof. Similarly, circles illustrated in grid regions 43 of FIG. 4 schematically show a state in which resin droplets 44 of the resin materials forming insulating layer 115 are impacted on grid region 43. In the example shown in FIG. 4, impact diameter R2 of impacted resin droplet 44 matches length L2 of square grid region 43 on one side thereof. In this case, metal droplet 42 and grid region 43 are less likely to wet and spread out from grid regions 41 and 43.

Figure 6:
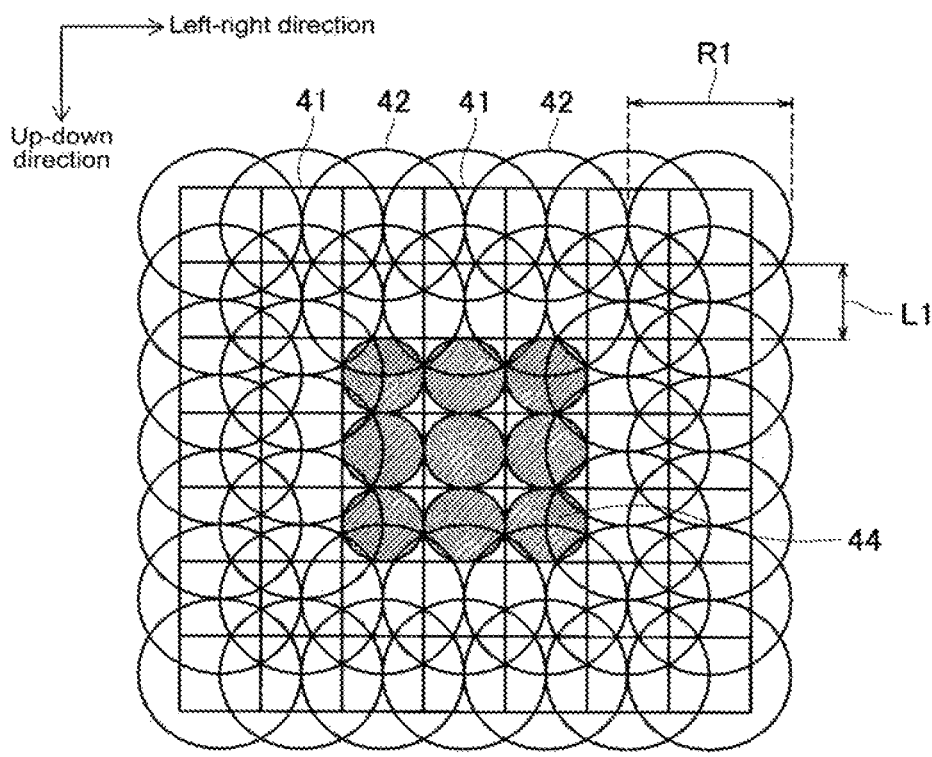
FIG. 6 is a schematic diagram illustrating the grid data when an impact diameter is 2 multiple.

On the other hand, FIG. 6 shows a state in which impact diameter R1 of metal droplet 42 is twice length L1 of grid region 41 on one side thereof. As shown in FIG. 6, metal droplet 42 wets and spreads out of grid region 41 at the time of impacting, and overlaps grid region 43 (insulating layer 115). In this case, wiring pattern 105 shaped with metal droplet 42 becomes larger than the shape designed by three-dimensional data D1. As a result, for example, there is a concern that a problem such as a conduction failure (short circuit) may occur due to connection between wiring patterns 105. On the other hand, in data conversion device 13 of the present embodiment, the positions of grid regions 41 and 43 for discharging metal droplets 42 and resin droplets 44 are changed in accordance with the sizes of impact diameters R1 and R2 and the sizes of grid regions 41 and 43 (lengths L1 and L2). Accordingly, the shaped pattern is suppressed from wetting and spreading (dispersing) the grid region of the other member.

3-4. Impact Diameter Determination Section 34

More specifically, impact diameter determination section 34 determines impact diameters R1 and R2 in accordance with various factors that cause impact diameters R1 and R2 to vary. FIG. 7 illustrates an example of associated data D7 in which grid data generation section 33 associates the various data described above. As illustrated in FIG. 7, associated data D7 is data in which the member information, the name of grid data D5, the type of an ink (material), the type of base, and the process conditions (printing and curing) are associated with each other. Note that, associated data D7 illustrated in FIG. 7 illustrates only a part (a part of data) necessary for impact diameter determination section 34 to determine impact diameters R1 and R2. Therefore, associated data D7 may include data other than the data illustrated in FIG. 7.

The member information in FIG. 7 is information for identifying a member of, for example, wiring pattern 105 or insulating layer 115 detected by layer information generation section 31. The name of grid data D5 is a name (identification information) set for each grid data D5 generated by grid data generation section 33. The type of an ink and the process condition are the material of the droplet determined by layer data division section 32, the unit information to be shaped, and the like. The base type is information of a member disposed under the layer data D3 (grid data D5) of the target to be shaped, that is, a member on which a droplet is ejected. The base type is determined, for example, by layer data division section 32 based on the material of the member located under the layer (underlayer) to be shaped.

Here, impact diameters R1 and R2 or droplets vary due to various factors. For example, if a contact angle determined by the wettability of the droplet to the base is large, when the droplets are impacted, the ranges of impact diameters R1 and R2, where the droplets wet and spread out, become wide. Similarly, the impact diameters R1 and R2 also vary according to a surface shape (such as unevenness) of the base. Impact diameters R1 and R2 also vary due to changes in a shaping environment for example a viscosity of the droplet which varies according to an in-door or out-door temperature, and a temperature change. Therefore, impact diameter determination section 34 of the present embodiment determines impact diameters R1 and R2 according to the wettability determined based on the droplet and the base to which the droplet is ejected, the surface shape of the base, the temperature, and the humidity.

For example, in addition to the type of an ink and the type of the base, data of a contact angle indicating wettability is set in associated data D7. Impact diameter determination section 34 determines impact diameters R1 and R2 based on the type of an ink, the type of the base, the contact angle, and the like. In a case where there are two or more types of base, that is, there are two or more types of base on the underlayer of one grid data D5, the impact diameter determination section 34 may determine impact diameters R1 and R2, for example, based on the base which occupies the largest proportion. Alternatively, impact diameter determination section 34 may calculate impact diameters R1 and R2 for each of the various types of base, and calculate an average value based on the occupation ratio of each base.

Further, impact diameter determination section 34 determines the surface shape of the base based on, for example, layer data D3 and grid data D5. Impact diameter determination section 34 corrects the values of impact diameters R1 and R2 based on the determined surface shape, more specifically, based on the unevenness of the surface, the inclination angle, and the like. In associated data D7, for example, associated data in which temperature, humidity, and viscosity are associated with each type of ink is set. Impact diameter determination section 34 acquires, from manufacturing apparatus 15 (temperature sensor or the like), for example, a temperature and a humidity of a room in which manufacturing apparatus 15 (see FIG. 1) is installed, or a temperature and a humidity in manufacturing apparatus 15. Impact diameter determination section 34 corrects impact diameters R1 and R2 based on the viscosity determined from acquired temperature or the like and a correspondence data of the associated data D7. In this manner, impact diameter determination section 34 determines impact diameters R1 and R2 based on various factors. The above-mentioned factors causing impact diameters R1 and R2 to vary are examples. Therefore, impact diameters R1 and R2 may be determined by employing various other factors.

Further, impact diameter determination section 34 may appropriately change the order (process order) or shaping multiple grid data D5 (wiring patterns 105 or insulating layers 115) on the same layer. For example, impact diameter determination section 34 may replace the order of the process for increasing a shaping accuracy when the shaping accuracy varies due to an influence of the type of an ink and the wettability which varies depending on the type of the base. Alternatively, impact diameter determination section 34 may replace the order of the process for reducing a damage when the damage to the droplet or the material of the base is reduced by changing the order of the process. Further, multiple pieces of grid data D5 having the same ink type but different base types may be combined to allow impact diameter determination section 34 to perform the shaping by one process.

Ejection position change section 35 changes the position to which the droplet is ejected on grid data D5 based on impact diameters R1 and R2 determined by impact diameter determination section 34 and the sizes of the grid regions 41 and 43 (for example, lengths L1 and L2). Ejection position change section 35 of the present embodiment sets grid regions 41 and 43 arranged at the edge portions of grid data D5 as non-ejection regions to which the droplets are not ejected, based on how many times the size of impact diameters R1 and R2 is the size of grid regions 41 and 43 (lengths L1 and L2). In the following description, annular wiring pattern 105 will be described as an example. Note that ejection position change section 35 performs the same processing on members other than wiring pattern 105 (for example, such as insulating layer 115).

First, when impact diameter R1 determined by the impact diameter determination section 34 is larger than length L1 of grid region 41, ejection position change section 35 determines whether impact diameter R1 is odd times or even times length L1. When calculating how many times the landing position is, in a case where the landing position is not divisible, ejection position change section 35 may perform rounding-down or rounding-up on a division result value depending on the setting condition of the user, the condition set in advance for each member, or the like. For example, ejection position change section 35 determines a multiple by rounding-down or rounding-up the division result value so as not to cause a conduction failure (short circuit) due to wetting and spreading of droplets on wiring pattern 105 or a conduction failure (disconnection of the wiring) due to reduction of the ejection position. For example, in a case where impact diameter R1 is within a range (($L1 \times 3 - \alpha$) to ($L1 \times 3 + \alpha$)) of a predetermined value a based on a value three times length L1 ($L1 \times 3$) as a criteria, ejection position change section 35 may uniformly determine that impact diameter R1 is odd times length L1. Similarly, in a case where impact diameter R1 is within a range (($L1 \times 2 - \alpha$) to ($L1 \times 2 + \alpha$)) of the predetermined value a based on a value two times length L1 ($L1 \times 2$) as a criteria, ejection position change section 35 may uniformly determine that impact diameter R1 is even times length L1. The predetermined value a is a value appropriately set in accordance with impact diameter R1 and length L1.

3-4-1. In Case of Odd Multiple

Figure 8:
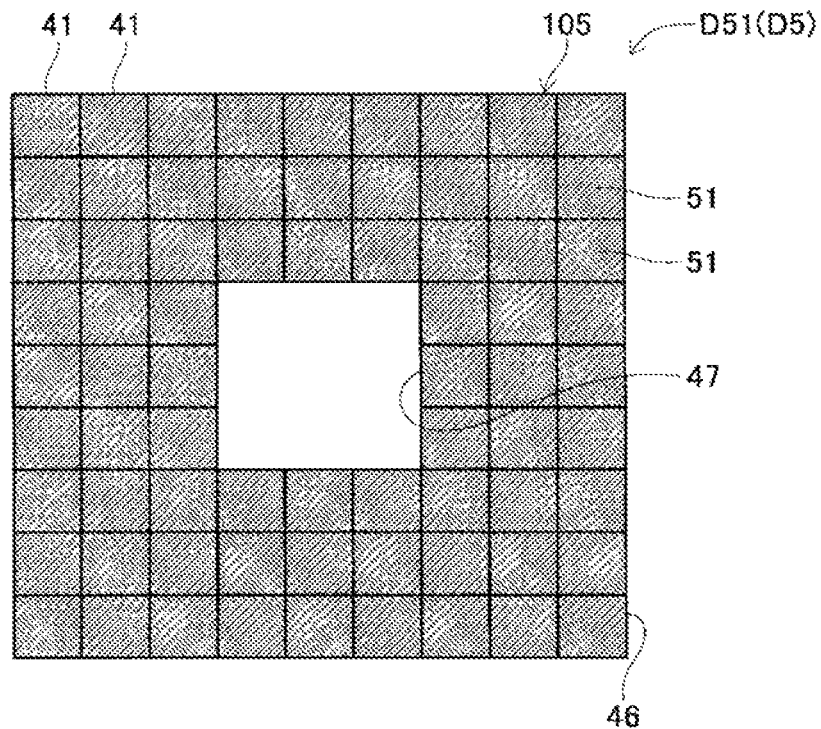
FIG. 8 is a schematic diagram for explaining a case where the impact diameter is odd multiple (3 multiple).
Figure 9:
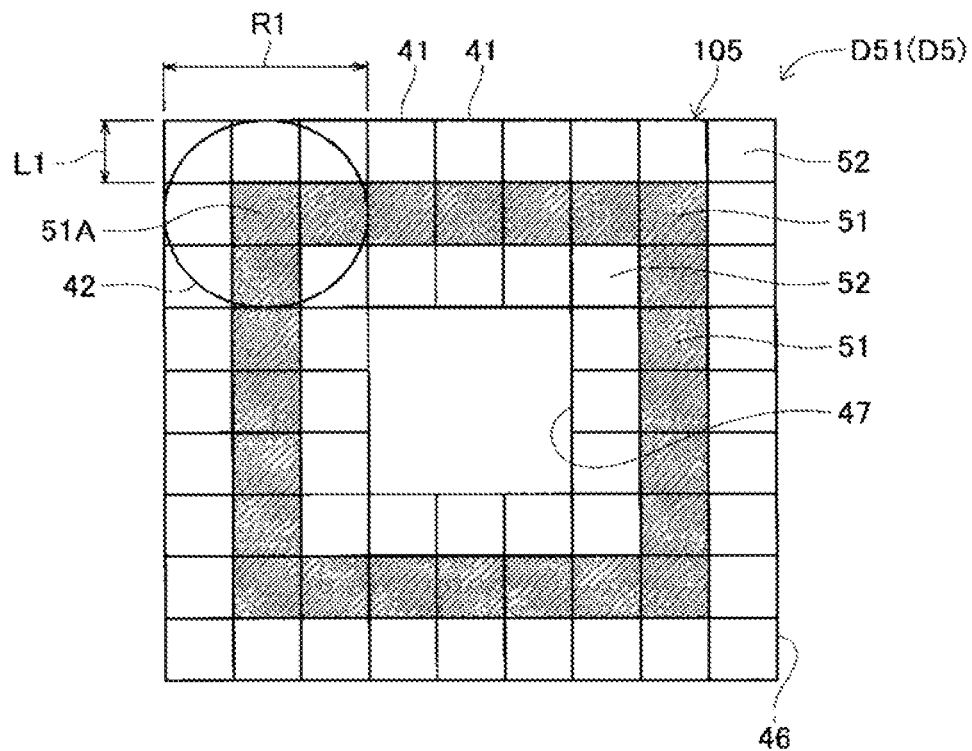
FIG. 9 is a schematic diagram for explaining the case where the impact diameter is odd multiple (3 multiple).

In a case where a size of impact diameter R1 is $2N+1$ times (N is a natural number) the size (length L1) of grid region 41, that is, in a case where impact diameter R1 is odd times length L1, ejection position change section 35 sets an N number of grid regions 41 from the edge portion of grid data D5 as non-ejection regions 52. FIGS. 8 and 9 show an example of grid region 41 in a case of odd multiple. Hatched grid region 41 in FIGS. 8 and 9 indicates ejection region 51 to which droplets (ink) is ejected. White (not hatched) grid regions 41 indicates non-ejection regions 52.

On grid data D51 illustrated in FIG. 8, annular wiring pattern 105, of which a width has a size of three grid regions 41 arranged side by side, is formed. On grid data D51, annular outer peripheral portion 46 and inner peripheral portion 47 are end portions (edge portions of the pattern) of wiring pattern 105 (member) to be shaped. In other words, grid region 41 disposed along outer peripheral portion 46 and inner peripheral portion 47 is a region to be in contact with other members (for example, wiring pattern 105 and insulating layer 115).

On the other hand, as illustrated in FIG. 9, impact diameter R1 of metal droplet 42 is three times ($2 \times 1 + 1$, N=1) length L1 of grid region 41. Therefore, ejection position change section 35 sets one (N numbers) grid regions 41 from the edge portion (outer peripheral portion 46 and inner peripheral portion 47) as non-ejection regions 52. As a result, as illustrated in FIG. 9, for example, metal droplet 42 ejected to arbitrary ejection region 51A (surrounded region) is accommodated in entire grid data D51, that is, a portion surrounded by outer peripheral portion 46 and inner peripheral portion 47. For example, in the case of elongated wiring pattern 105, the lateral end portions on both sides in the width direction are defined as non-ejection regions 52, and the wetting and spreading in the width direction is suppressed.

Figure 10:
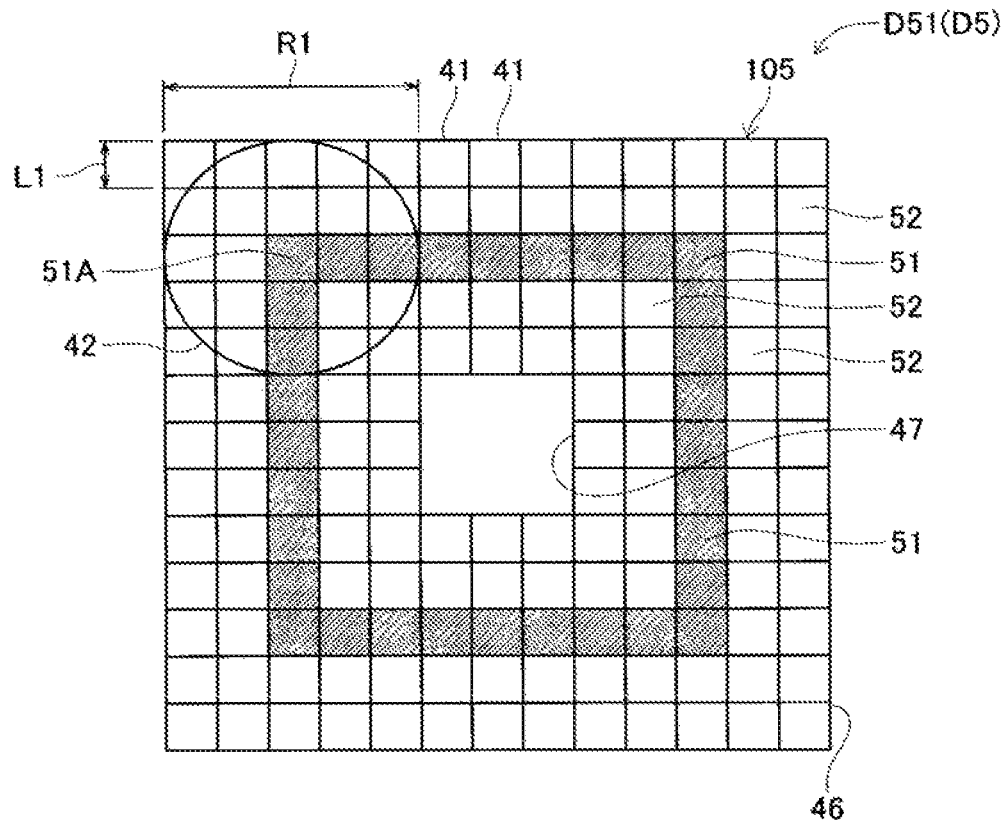
FIG. 10 is a schematic diagram for explaining the case where the impact diameter is odd multiple (5 multiple).

Ejection position change section 35 performs the same processing as long as the landing diameter is odd times the length of the grid region. FIG. 10 illustrates a case where impact diameter R1 of metal droplet 42 is five times (2×2+1, N=2) length L1 of grid region 41. In this case, ejection position change section 35 sets two (N numbers) grid regions 41 from the edge portions (outer peripheral portion 46 and inner peripheral portion 47) as non-ejection regions 52. As a result, as in the case illustrated in FIG. 9, for example, metal droplet 42 ejected to arbitrary ejection region 51A (surrounded region) is accommodated in entire grid data D51, that is, a portion surrounded by outer peripheral portion 46 and inner peripheral portion 47.

3-4-2. In Case of Even Multiple

Next, the case where the landing diameter is even multiple will be described. When the size of impact diameter R1 is 2N times (N is a natural number) the size (length L1) of grid region 41, that is, impact diameter R1 is even multiple, for example ejection position change section 35 sets an N number of grid regions 41 from an edge portion along the up-down direction (first direction) as non-ejection regions 52. Ejection position change section 35 deviates grid regions 41 (ejection region 51) other than non-ejection regions 52 toward non-ejection regions 52 along the left-right direction (perpendicular direction of the up-down direction) by a distance obtained by multiplying length L1 of one side in grid region 41 along the left-right direction (second direction) by (N−½).

Figure 11:
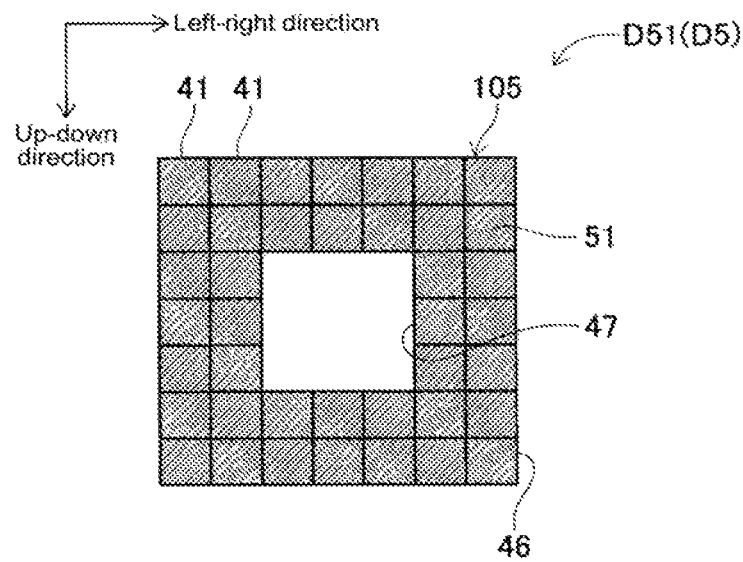
FIG. 11 is a schematic diagram for explaining the case where the impact diameter is even multiple (2 multiple).
Figure 12:
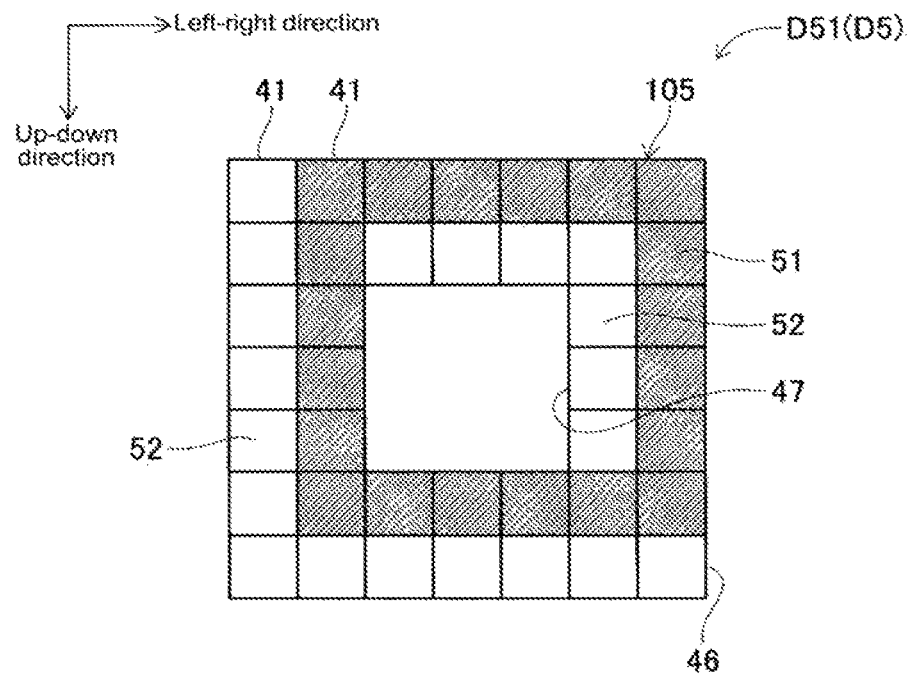
FIG. 12 is a schematic diagram for explaining the case where the impact diameter is even multiple (2 multiple).
Figure 13:
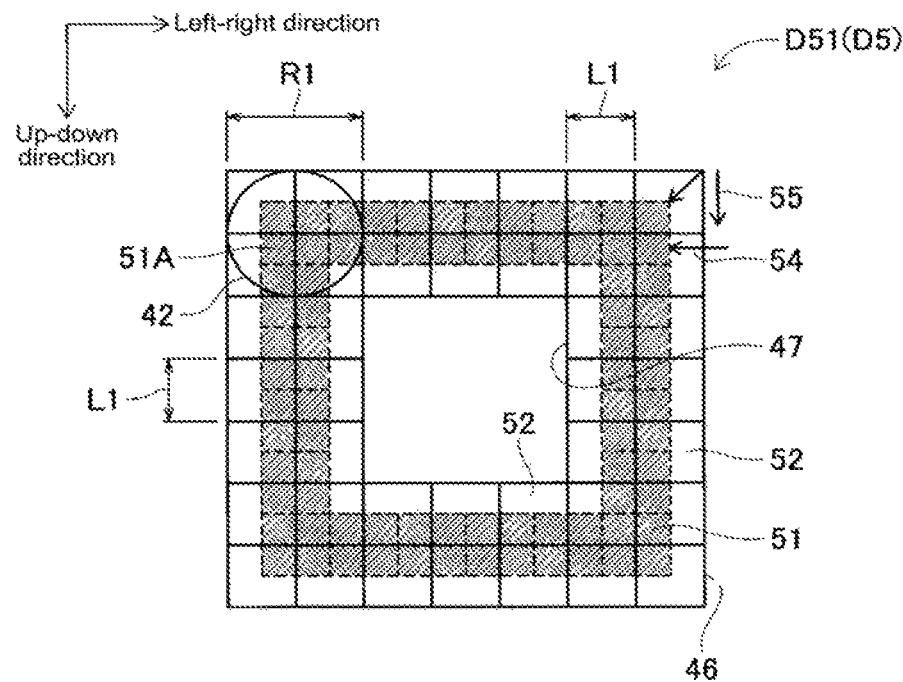
FIG. 13 is a schematic diagram for explaining the case where the impact diameter is even multiple (2 multiple).

FIGS. 11 to 13 illustrate an example of grid region 41 in a case of odd multiple. On grid data D51 illustrated in FIG. 11, annular wiring pattern 105, of which a width has a size of two grid regions 41 arranged side by side, is formed. On grid data D51, annular outer peripheral portion 46 and inner peripheral portion 47 are end portions (edge portions of the pattern) of wiring pattern 105 (member) to be shaped.

On the other hand, as illustrated in FIG. 13, impact diameter R1 of metal droplet 42 is two times (2×1, N=1) length L1 of grid region 41. For example, as illustrated in FIG. 12, ejection position change section 35 sets one grid (N numbers) region 41 from the edge portion (edge portion on left side in FIG. 12) along the up-down direction (first direction) between the up-down direction and the left-right direction as non-ejection regions 52. Further, as illustrated in FIG. 13, ejection position change section 35 deviates (refer to arrow 54 of FIG. 13) grid regions 41 (ejection region 51) other than non-ejection regions 52 toward non-ejection regions 52 side (left side of FIG. 13) along the left-right direction (second direction) by a distance obtained by dividing length L1 of grid region 41 on one side thereof along the left-right direction (second direction) in half ((N−½) times).

Here, wiring pattern 105 illustrated in FIG. 11 includes edge portions (outer peripheral portion 46 and inner peripheral portion 47) in both the left-right direction and the up-down direction. Therefore, ejection position change section 35 performs the above-described processing by interchanging the up-down direction and the left-right direction. More specifically, as illustrated in FIG. 12, ejection position change section 35 sets one (N numbers) grid regions 41 from the edge portion (edge portion on the lower side in FIG. 12) along the left-right direction (first direction) as non-ejection regions 52. Further, as illustrated in FIG. 13, ejection position change section 35 deviates (refer to arrow 55 of FIG. 13) grid regions 41 (ejection region 51) other than non-ejection regions 52 toward non-ejection regions 52 side (lower side of FIG. 13) along the up-down direction (second direction) by a distance obtained by dividing length L1 of grid region 41 on one side thereof along the up-down direction (second direction) in half ((N−½) times).

As a result, ejection region 51 after movement is deviated from grid region 41 before movement. As a result, as illustrated in FIG. 13, metal droplet 42 ejected to arbitrary ejection region 51A (surrounded region) is accommodated in entire grid data D51 before movement, that is, a portion surrounded by outer peripheral portion 46 and inner peripheral portion 47.

Figure 14:
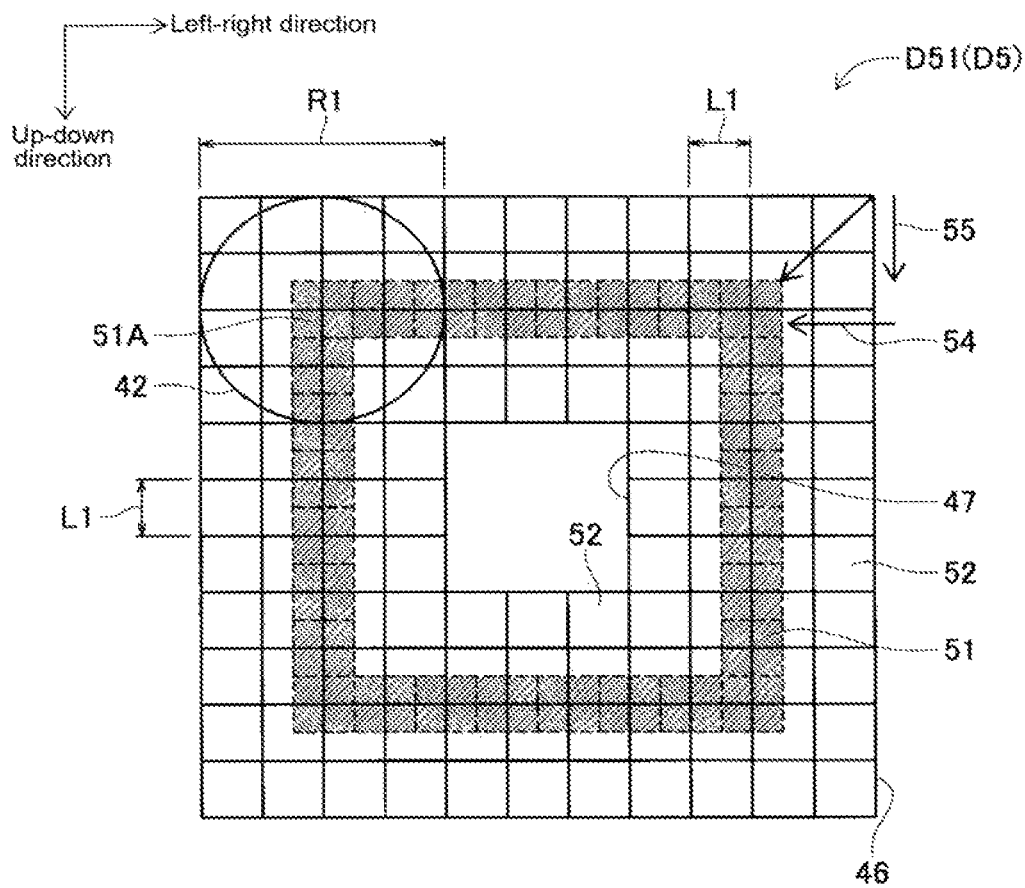
FIG. 14 is a schematic diagram for explaining the case where the impact diameter is even multiple (4 multiple).

Ejection position change section 35 performs the same processing as long as the landing diameter is even multiple. FIG. 14 illustrates a case where impact diameter R1 of metal droplet 42 is four times (2×2, N=2) length L1 of grid region 41. In this case, ejection position change section 35 sets, for example, two (N numbers) grid regions 41 from the edge portion along the up-down direction (edge portion on left side in FIG. 14) as non-ejection regions 52. Further, ejection position change section 35 deviates (refer to arrow 54 of FIG. 14) grid regions 41 (ejection region 51) other than non-ejection regions 52 toward non-ejection regions 52 side (left side of FIG. 14) along the left-right direction by a distance obtained by multiplying length L1 of one side in grid region 41 along the left-right direction by 3/2 ((N−½) times). Therefore, ejection position change section 35 performs the above-described processing by interchanging the up-down direction and the left-right direction (refer to arrow 55 of FIG. 14). As a result, as illustrated in FIG. 14, metal droplet 42 ejected to arbitrary ejection region 51A (surrounded region) is accommodated in entire grid data D51.

3-4-3. Adjustment of Wetting Width

Ejection position change section 35 sets grid regions 41 and 43 of the edge portion in grid data D51 as non-ejection regions 52 in which the droplets are not ejected, in accordance with flow width W which is a width in which the multiple ejected droplets flow out to the outside of grid regions 41 and 43 by overlapping with each other. Here, the size (width, and the like) of the shaped member may become larger than impact diameters R1 and R2 in a case where the discharged droplets greatly overlap each other.

Figure 15:
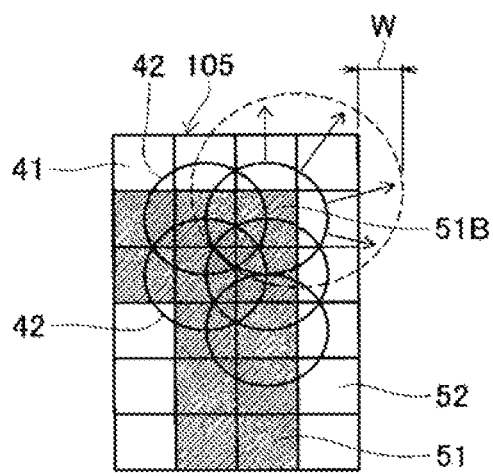
FIG. 15 is a schematic diagram for explaining a wet width.

FIG. 15 illustrates an example of the flow width W caused by overlapped metal droplets 42 when metal droplets 42 overlap each other. Further, as an example, FIG. 15 illustrates a state after non-ejection region 52 is set in accordance with the above-mentioned odd-multiple and even-multiple conditions. Ejection region 51B illustrated in FIG. 15 is located at a corner of wiring pattern 105. In ejection region 51B, metal droplets 42 ejected to adjacent ejection region 51 and metal droplets 42 ejected to ejection region 51B overlap each other. As a result, metal droplet 42 after impacting may wet and spread to a portion indicated by a broken line in FIG. 15. Therefore, ejection position change section 35 sets, for example, ejection region 51B at the corner as non-ejection region 52 in consideration of flow width W of metal droplet 42 that wet and spread as illustrated in FIG. 15. As a result, it is possible to suppress the size (width, and the like) of the shaped member from becoming larger than impact diameters R1 and R2. Ejection position change section 35 can determine the flow width W based on, for example, the number of adjacent ejection regions 51, the overlapping state of metal droplets 42, the viscosity of metal droplets 42, the wettability of base, the shape of base, and the like.

3-5. Control Content Determination Section 38

Control content determination section 38 illustrated in FIG. 2 generates control data D8 to which how to operate each shaping unit is set based on associated data D7 associated and stored in memory section 25 by grid data generation section 33. For example, control content determination section 38 generates control data D8 for detecting an ejection position of wiring pattern 105 based on grid data D5 changed by ejection position change section 35, and operating stage unit 61 and first shaping unit 63 (described later, see FIG. 16) in a cooperative manner in accordance with the detected ejection position. Control content determination section 38 stores generated control data D8 in memory section 25.

Data conversion device 13 is connected to manufacturing apparatus 15 via input and output section 23. Data conversion device 13 reads out, from memory section 25, control data D8 (data based on associated data D7 or grid data D5) converted from three-dimensional data D1 by layer information generation section 31, and outputs the data to manufacturing apparatus 15 through input and output section 23. Manufacturing apparatus 15 manufactures electronic device 200 by lamination shaping, based on control data D8 input from data conversion device 13.

4. Configuration of Manufacturing Apparatus 15

Figure 16:
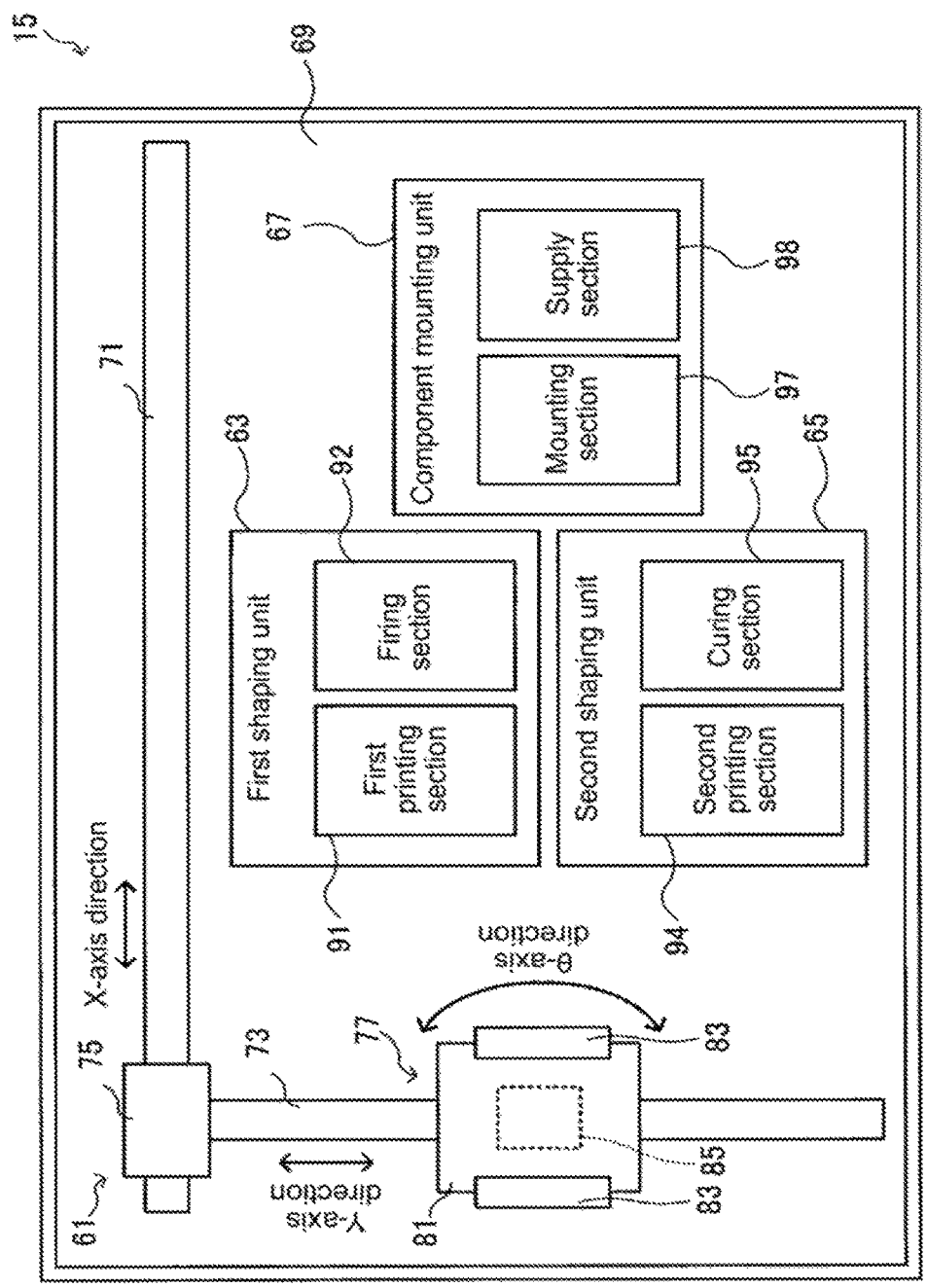
FIG. 16 is a schematic diagram illustrating a configuration of an electronic device manufacturing apparatus.

Next, the configuration of manufacturing apparatus 15 will be described. FIG. 16 schematically illustrates a plan view of manufacturing apparatus 15. Manufacturing apparatus 15 includes stage unit 61, first shaping unit 63, second shaping unit 65, and component mounting unit 67. In manufacturing apparatus 15, stage unit 61 and the like are disposed above base 69. Base 69 has a substantially rectangular shape in plan view. In the following description, a longitudinal direction of base 69 is an X-axis direction, a widthwise direction of base 69 is a Y-axis direction, a direction perpendicular to both the Y-axis direction, the X-axis direction is a Z-axis direction, and a rotation direction about a straight line along the Z-axis direction is a θ-axis direction.

Stage unit 61 has X-axis slide mechanism 71 extending in the X-axis direction and Y-axis slide mechanism 73 extending in the Y-axis direction. In X-axis slide mechanism 71, X-axis slider 75 moves to an arbitrary position in the X-axis direction in response to driving of an electromagnetic motor (not illustrated). One end of Y-axis slide mechanism 73 in the Y-axis direction is held by X-axis slider 75, and stage 77 is provided on Y-axis slide mechanism 73 so as to be movable in the Y-axis direction. Therefore, stage 77 can be moved to an arbitrary position on base 69 by driving X-axis slide mechanism 71 and Y-axis slide mechanism 73.

Stage 77 has base 81 and holding device 83. Base 81 is formed in a flat plate shape and shaping plate P (see FIG. 17) is mounted on an upper face thereof. Stage 77 fixedly holds shaping plate P in a predetermined position by sandwiching an end of shaping plate P mounted on base 81 between base 81 and holding device 83. Stage unit 61 includes lifting and lowering device 85 for lifting and lowering base 81 in the Z-axis direction together with shaping plate P. Lifting and lowering device 85 lifts or lowers base 81 to change the position of shaping plate P in the Z-axis direction. Lifting and lowering device 85 is capable of rotating base 81 in the θ-axis direction.

First shaping unit 63 and the like perform various operations such as a shaping of a three-dimensional shaped article and a mounting of electronic component 125 (see FIG. 17) on shaping plate P from upper side of stage 77 and shaping plate P. First shaping unit 63 is, for example, a unit for shaping wiring pattern 105 and pillars 121 and 129 of electronic device 200 (see FIG. 17), and includes first printing section 91 and firing section 92. First printing section 91 drives, for example, an inkjet head (not illustrated) to eject a conductive material onto shaping plate P. Conductive material is, for example, an ink containing metal nanoparticles (such as silver). The inkjet head discharges the conductive material from multiple nozzles arranged in parallel in the Y-axis direction by, for example, a piezoelectric method using a piezoelectric element. Information such as the function of first printing section 91, the material to be used, the size of the droplet, and the like is stored in memory section 25 as manufacturing apparatus information D4 (see FIG. 2).

Firing section 92 fires the conductive material discharged onto shaping plate P by irradiating the conductive material with laser light. When shaping plate P moves to a position below first printing section 91 in accordance with the movement of stage 77, first shaping unit 63 forms wiring pattern 105 and pillars 121 and 129 by causing inkjet head to eject conductive material onto shaping plate P and firing section 92 to fire the ejected conductive material.

Second shaping unit 65 is, for example, a unit for shaping insulating layer 115 of electronic device 200 (see FIG. 17), and includes second printing section 94 and curing section 95. Second printing section 94 drives, for example, an inkjet head (not illustrated) to eject a UV curable resin onto shaping plate P. The inkjet head may use for example, a piezoelectric method using a piezoelectric element, or a thermal method in which a resin is heated to generate air bubbles, and the air bubbles are discharged from a nozzle port. Curing section 95 irradiates the ultraviolet curable resin discharged onto shaping plate P with ultraviolet rays to cure the UV curable resin. When shaping plate P moves to a position below second printing section 94 in accordance with the movement of stage 77, second shaping unit 65 shapes insulating layer 115 by causing second printing section 94 to eject UV curable resin onto shaping plate P while causing curing section 95 to cure the ejected UV curable resin.

Component mounting unit 67 is a unit for mounting wiring pattern 105 shaped by first shaping unit 63 and various electronic components 125 (see FIG. 17) connected to pillars 121 and 129, and includes mounting section 97 and supply section 98. Mounting section 97 has a mounting head for holding electronic component 125 by a suction nozzle (not illustrated). Supply section 98 has, for example, multiple tape feeders for feeding taped electronic components 125 one by one, and supplies electronic components 125 to mounting section 97. For example, when shaping plate P moves to a position below mounting section 97 with the movement of stage 77, component mounting unit 67 moves the mounting head of mounting section 97 to the component supply position of supply section 98, and drives supply section 98 to supply necessary components. Then, mounting section 97 mounts electronic component 125 sucked and held by the suction nozzle of the mounting head from the supply position of supply section 98, for example, on the position of pillar 121 shaped on shaping plate P.

Figure 17:
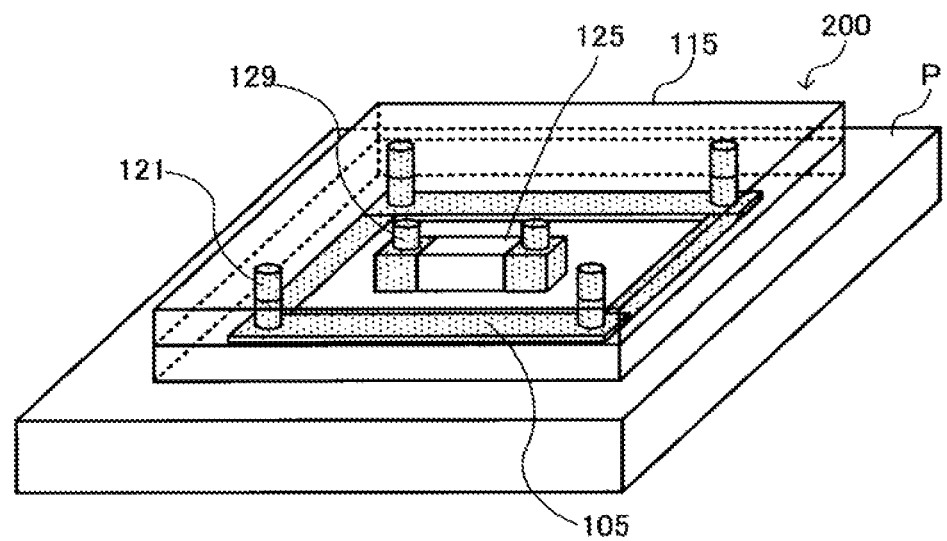
FIG. 17 is a perspective view illustrating an electronic device that is a target object of a shaping.

In system 10 of the present embodiment, for example, three-dimensional data D1 of electronic device 200 illustrated in FIG. 17 is converted into control data D8 by data conversion device 13 by the above-described configuration. In this conversion processing, ejection position change section 35 reduces the position to which the droplet is ejected on grid data D5 in accordance with impact diameters R1 and R2. Based on control data D8 converted by data conversion device 13, manufacturing apparatus 15 shapes electronic device 200 by sequentially laminating layers on shaping plate P. As a result, wiring pattern 105 or the like of the electronic device 200 to be shaped does not greatly protrude from the pattern designed in the three-dimensional data D1, and the occurrence of a defect (such as short circuit or disconnection) is suppressed.

Incidentally, in the above embodiment, electronic device 200 is an example of a target object. Lengths L1 and L2 are examples of the sizes of grid regions 41 and 43. Outer peripheral portion 46 and inner peripheral portion 47 are examples of edge portions.

5. Effect

Thus, according to the first embodiment that has been described heretofore, the following advantageous effects are provided. Data conversion device 13 of the present embodiment includes layer data division section 32 configured to generate layer data D3 based on three-dimensional data D1 of a target object to be subjected to the lamination shaping (electronic device 200), layer data D3 in which electronic device 200 is divided into each layer having a thickness capable of being shaped by an inkjet method, a grid data generation section 33 configured to generate grid data D5 in which layer data D3 is defined by each of grid regions 41 and 43 indicating the position to which the droplet is ejected by the inkjet method, impact diameter determination section 34 configured to determine impact diameters R1 and R2 when the droplet is ejected, and ejection position change section 35 configured to change the position to which the droplet is ejected on grid data D5 based on impact diameters R1 and R2 determined by impact diameter determination section 34 and the sizes (lengths L1 and L2) of grid regions 41 and 43.

According to this, layer data division section 32 generates layer data D3 obtained by dividing electronic device 200 by a predetermined thickness based on three-dimensional data D1 of electronic device 200 (target object) to be shaped by the inkjet method. Grid data generation section 33 defines layer data D3 by grid regions 41 and 43 to generate grid data D5. Then, ejection position change section 35 changes the position to which the droplet is ejected on grid data D5 based on impact diameters R1 and R2 of the droplet determined by impact diameter determination section 34 and the sizes of grid regions 41 and 43 (lengths L1 and L2). As a result, after the position is changed, grid data D5 becomes data which takes the size of grid regions 41 and 43 and the impact diameters R1 and R2 of the droplet into consideration. Therefore, by generating grid data D5 corresponding to impact diameters R1 and R2, a desired shape of pattern can be formed even if impact diameters R1 and R2 vary.

Impact diameter determination section 34 determines impact diameters R1 and R2 according to at least one of the wettability of the liquid droplet to the base to which the liquid droplet is ejected, the surface shape of the base, the temperature, and the humidity. Impact diameters R1 and R2 of the droplets vary due to various factors. Therefore, impact diameter determination section 34 can determine a more appropriate impact diameter in accordance with the conditions.

Grid data D5 is data in which grid regions 41 are arranged in a matrix. Ejection position change section 35 sets grid regions 41 disposed at the edge portion (outer peripheral portion 46 and inner peripheral portion 47) in grid data D5 as non-ejection regions 52 to which the droplets are not ejected, based on how many times the size of impact diameters R1 and, R2 is the size (lengths L1 and L2) of grid regions 41 and 43.

According to this, when impact diameters R1 and R2 are larger than grid regions 41 and 43, the discharged and impacted liquid droplet spreads to the outside of the end portion of the member to be shaped (for example, outer peripheral portion 46 of wiring pattern 105), that is, the possibility that the droplet spreads out to the region of the other member becomes high. Therefore, when impact diameters R1 and R2 are larger than grid regions 41 and 43, ejection position change section 35 sets grid regions 41 and 43 of the edge portion (end portion of the member, for example, inner peripheral portion 47) of grid data D5 as non-ejection regions 52 based on the ratio between the sizes of impact diameters R1 and R2 and the sizes of grid regions 41 and 43. As a result, the ejection position of the edge portion after the change positioned inside as compared with the ejection position of the edge portion before the change, and it is possible to suppress the droplet from spreading to the region of the other member.

When the size of impact diameters R1 and R2 is 2N+1 (N is a natural number) times the size of grid regions 41 and 43 (lengths L1 and L2), ejection position change section 35 sets an N number of grid regions 41 and 43 from the edge portion (such as outer peripheral portion 46) as non-ejection regions 52.

According to this, impact diameters R1 and R2 are odd times the sizes (lengths L1 and L2) of grid regions 41 and 43. In this case, ejection position change section 35 sets an N number of grid regions 41 and 43 (one grid region, in case of 3 multiple) from the edge portion as non-ejection regions 52. As a result, non-ejection regions 52 can be easily determined based on the ratio between the sizes impact diameters R1 and R2 and the sizes of grid regions 41 and 43.

Grid regions 41 and 43 have a rectangular shape and are arranged along an up-down direction (first direction) and a left-right direction (second direction) orthogonal to the first direction. In a case where the size of impact diameters R1 and R2 is 2N times (N is a natural number) the size (lengths L1 and L2) of grid regions 41 and 43, ejection position change section 35 sets an N number of grid regions 41 and 43 from the edge portion along the up-down direction as non-ejection regions 52, and deviates grid regions 41 (ejection area 51) other than non-ejection regions 52 toward non-ejection regions 52 along the left-right direction by a distance obtained by multiplying lengths L1 and L2 of one side in grid regions 41 and 43 along the left-right direction by (N−½).

According to this, the size of impact diameters R1 and R2 is even times the size of grid regions 41 and 43. In this case, ejection position change section 35 sets an N number of grid regions 41 and 43 (one grid region, in a case of 2 multiple) from the edge portion along the first direction (for example, up-down direction) as the non-ejection regions 52. Further, grid regions 41 and 43 other than non-ejection regions 52, that is, ejection region 51, are deviated toward non-ejection regions 52 along the second direction (for example, the left-right direction) by a distance (0.5, in a case of 2 multiple) obtained by multiplying lengths L1 and L2 of one side in grid regions 41 and 43 along the second direction by (N−½). As a result, by setting non-ejection regions 52 at one edge portion of grid data D5 and moving grid regions 41 and 43 to non-ejection regions 52 side, even in a case of even multiple, it is possible to appropriately suppress the liquid droplets from spreading to the region of the other member.

Layer data division section 32 generates layer data D3 for each member included in three-dimensional data D1. In a case where the materials of the members are the same, grid data generation section 33 makes the sizes of grid regions 41 and 43 defining layer data D3 the same.

According to this, grid data generation section 33 defines the members of the same material, such as wiring pattern 105, by grid regions 41 and 43 having the same size. For this reason, the layer having uniform thickness can be shaped by shaping with same type of droplet (ink) in a same amount on the members of the same material.

Ejection position change section 35 sets grid regions 41 and 43 of the edge portion in grid data D5 as non-ejection regions 52 to which the droplets are not ejected, in accordance with flow width W in which the multiple ejected droplets flow out to the outside of grid regions 41 and 43 by overlapping with each other.

According to this, ejection position change section 35 sets grid regions 41 and 43 of the edge portions (such as outer peripheral portion 46) as non-ejection regions 52 in accordance with flow width W in which the ejected liquid droplets flow out to the outside of grid regions 41 and 43 by overlapping each other. As a result, non-ejection regions 52 can be set in consideration of the width of the droplets overlapped each other after impacting with spreading to the outside of grid regions 41 and 43, so as to appropriately suppress the wetting and spreading of the droplets to the regions of other members.

6. Second Embodiment

Next, a second embodiment of the present application will be described. In the first embodiment, ejection position change section 35 changes (reduces) the ejection position by setting predetermined ejection regions 51 as non-ejection regions 52 based on impact diameters R1 and R2 and the sizes (lengths L1 and L2) of grid regions 41 and 43, but the method of changing the ejection position is not limited thereto.

For example, when the size of impact diameters R1 and R2 is larger than the size (lengths L1 and L2) of grid regions 41 and 43, ejection position change section 35 may change multiple adjacent grid regions 41 and 43 to one of grid regions 41 and 43 in accordance with the ratio between the sizes of impact diameters R1 and R2 and the size (lengths L1 and L2) of grid regions 41 and 43 to reduce the position to which the droplet is ejected.

Figure 18:
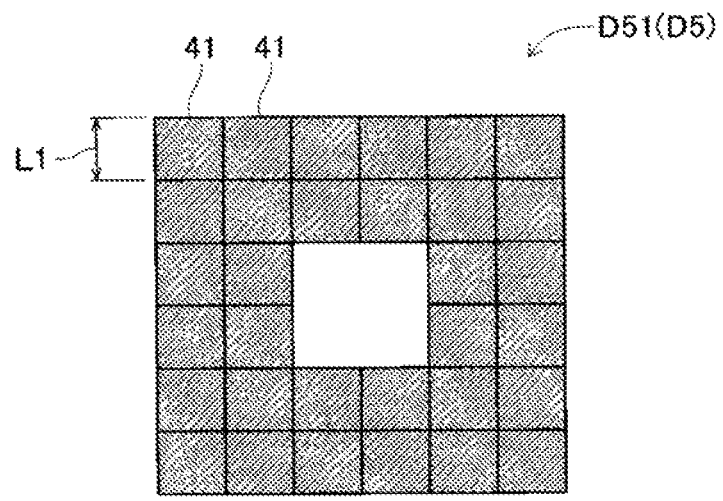
FIG. 18 is a schematic diagram illustrating grid data before combining a grid region in a second embodiment.
Figure 19:
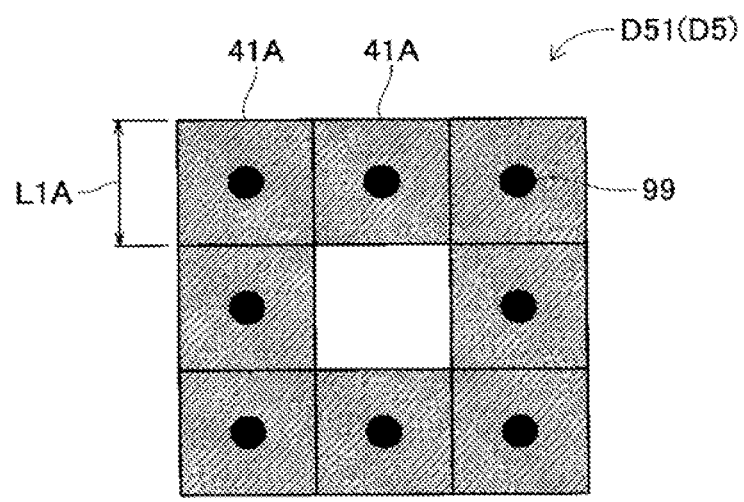
FIG. 19 is a schematic diagram illustrating grid data after combining the grid region.

FIG. 18 illustrates an example of grid data D51 before combining grid regions 41. FIG. 19 illustrates grid data D51 after combining grid regions 41. As shown in FIGS. 18 and 19, ejection position change section 35 may combine, for example, four adjacent grid regions 41 (two columns and two rows) into one grid region 41A. Length L1A of grid region 41A after combining is twice the length L1 before combining. Center 99 of the position after combining at which the droplet is ejected is, for example, the center of grid region 41A after combining.

In the first embodiment, ejection regions 51 at the edge portion of grid data D5 are set as non-ejection regions 52. However, in a case where lengths L1 and L2 of grid regions 41 and 43 are short, that is, in a case where the resolution of grid data D5 is fine and the droplet is easily wet and spread, the droplet may wet and spread more than expected. Therefore, ejection position change section 35 combines (coarsen the resolution) adjacent grid regions 41 into one grid region 41A to reduce the ejection position.

According to this, ejection position change section 35 changes (combines) multiple adjacent grid regions 41 into one grid region 41A in accordance with how large impact diameters R1 and R2 are compared with grid regions 41 and 43, thereby reducing (thinning out) the number of grid regions 41 in entire grid data D5. As a result, the positions (number of the positions) to which liquid droplets are ejected in a single scan can be reduced as a whole, and the wetting and spreading of the liquid droplets to the region of the other member can be suppressed. The shaping count number may be increased in accordance with the amount of roughened resolution, that is, the number of combined grid regions 41. For example, when length L1 is set as length L1A (when double the size), four grid regions 41 are set as one grid region 41A, so that the amount of discharged droplets is ¼ multiple. Therefore, shaping process, such as printing and curing, may be performed repeatedly four times on grid data D5 after thinning. Accordingly, it is possible to shape a desired shape while suppressing wetting and spreading in one scan.

7. Modified Example

It should be noted that the disclosure is not limited to each embodiment that has been described heretofore and hence can be carried out in various modes based on various modifications and improvements made based on the knowledge of those skilled in the art. For example, although impact diameter determination section 34 determines impact diameters R1 and R2 according to the wettability, the surface shape of the base, air temperature, and humidity, impact diameters R1 and R2 may be determined based on at least one of these conditions. The size of grid regions 41 and 43 in the present application are not limited to lengths L1 and L2 on one side thereof, and may be other values representing the size of grid regions 41 and 43, such as the length of a diagonal line, for example. Further, ejection position change section 35 may change the ejection position by using both the processing of the first embodiment (processing of multiple) and the processing of the second embodiment (processing of roughening resolution).

Three-dimensional data D1 is not limited to data designed by CAD, and may be data designed by a tool capable of designing other three-dimensional objects. In the above-described embodiment, manufacturing apparatus 15 shaping electronic device 200 based on control data D8 converted by data conversion device 13, but may also shape with using other intermediate data.

REFERENCE SIGNS LIST 10 lamination shaping system, 13 data conversion device, 15 manufacturing apparatus, 31 layer information generation section, 32 layer data division section, 33 grid data generation section, 34 impact diameter determination section, 35 ejection position change section, 41 and 43 grid region, 46 outer peripheral portion (edge portion), 47 inner peripheral portion (edge portion), 52 non-ejection region, 200 electronic device (target object), D1 three-dimensional data, D2 layer information, D3 layer data, D5 grid data, R1 and R2 impact diameter, L1 and L2 length, W flow width

The invention claimed is:

1. A data conversion device comprising:
a layer data division section configured to generate layer data by dividing a target object into layers each having a thickness capable of being shaped by an inkjet method based on three-dimensional data of the target object to be subjected to lamination shaping;
a grid data generation section configured to generate grid data by defining the layer data by grid regions, each indicating a position to which a droplet is ejected by the inkjet method;
an impact diameter determination section configured to determine an impact diameter when the droplet is ejected; and
an ejection position change section configured to change a position to which the droplet is ejected on the grid data based on the impact diameter, being determined by the impact diameter determination section, and a size of the grid region.

2. The data conversion device according to claim 1, wherein the impact diameter determination section determines the impact diameter according to at least one of wettability of the droplet to a base to which the droplet is ejected, a surface shape of the base, air temperature, and humidity.

3. The data conversion device according to claim 1, wherein the grid data is data in which the grid regions are arranged in a matrix, and wherein the ejection position change section sets the grid regions arranged at an edge portion in the grid data as non-ejection regions, to each of which the droplet is not ejected, based on how many times the size of the impact diameter is the size of the grid region.

4. The data conversion device according to claim 3, wherein the ejection position change section sets an N number of the grid regions from the edge portion as the non-ejection regions in a case where the size of the impact diameter is 2N+1 times (N is a natural number) the size of the grid regions.

5. The data conversion device according to claim 3, wherein the grid regions form a rectangular shape and are arranged along a first direction and a second direction perpendicular to the first direction, and
wherein the ejection position change section sets an N number of the grid regions from the edge portion along the first direction as the non-ejection regions in a case where the size of the impact diameter is 2N times (N is a natural number) the size of the grid region, and deviates the grid regions other than the non-ejection regions toward the non-ejection regions along the second direction by a distance obtained by multiplying a length of one side in the grid region along the second direction by $(N-\frac{1}{2})$.

6. The data conversion device according to claim 1, wherein, in a case where the size of the impact diameter is larger than the size of the grid region, the ejection position change section changes multiple adjacent grid regions to one grid region in accordance with a ratio between the size of the impact diameter and the size of the grid region to reduce the position to which the droplet is ejected.

7. The data conversion device according to claim 1, wherein the layer data division section generates the layer data for each member included in the three-dimensional data, and
wherein the grid data generation section sets the sizes of the grid regions defining the layer data the same as each other in a case where materials of the members are the same as each other.

8. The data conversion device according to claim 1, wherein the ejection position change section sets the grid regions of an edge portion in the grid data as the non-ejection regions to which the droplet is not ejected, in accordance with a flow width in which multiple ejected droplets flow out to an outside of the grid region by overlapping each other.

9. A lamination shaping system for shaping a target object by an inkjet method based on the grid data converted by the data conversion device according to claim 1.

* * * * *